United States Patent [19]

Michaels et al.

[11] Patent Number: 4,549,312
[45] Date of Patent: Oct. 22, 1985

[54] RADIO RECEIVER WITH AUTOMATIC INTERFERENCE AND DISTORTION COMPENSATION

[75] Inventors: Sheldon B. Michaels, Acton; Mark J. Giubardo, Chelmsford, both of Mass.

[73] Assignee: Digital Marine Electronics Corporation, Acton, Mass.

[21] Appl. No.: 125,973

[22] Filed: Feb. 29, 1980

[51] Int. Cl.[4] .................. H03B 1/04; H04B 1/12
[52] U.S. Cl. .................. 455/311; 455/295; 455/307; 328/167
[58] Field of Search .............. 455/307, 311, 295; 375/99, 101, 102, 103; 328/165, 168, 167; 333/17 R

[56] References Cited

U.S. PATENT DOCUMENTS

| | | | |
|---|---|---|---|
| 3,281,698 | 10/1966 | Rose, Jr. | 455/307 |
| 3,562,675 | 2/1971 | Urell | 328/167 |
| 3,737,799 | 6/1973 | Stander | 455/307 |
| 3,744,015 | 7/1973 | Marimon | 455/307 |
| 3,787,774 | 1/1974 | Tietze | 328/167 |
| 3,868,690 | 2/1975 | Miller | 343/103 |
| 4,320,523 | 3/1982 | Horikawa | 455/307 |
| 4,381,348 | 7/1981 | Shizuya | 455/307 |
| 4,395,779 | 7/1983 | Fujino | 328/167 |

Primary Examiner—Tommy P. Chin
Attorney, Agent, or Firm—Robert T. Dunn

[57] ABSTRACT

Undesired, interfering narrow band received signals in a Loran-C receiver are automatically rejected and the resulting distortion of the received Loran beacon signals caused by this rejection is automatically compensated for. The received Loran-C beacon signals in the band 90 to 110 KHz are fed through a narrow band, variable reject filter that rejects the undesired signal and is controlled by a feedback circuit in response to an interference detector in the receiver, so that the reject filter is automatically set at the interfering signal, rejecting it. Meanwhile, distortion of the received Loran beacon signals caused by the rejection is compensated for by an automatic circuit that varies a delay and add circuit in the Loran receiver to compensate for the distortion.

34 Claims, 13 Drawing Figures

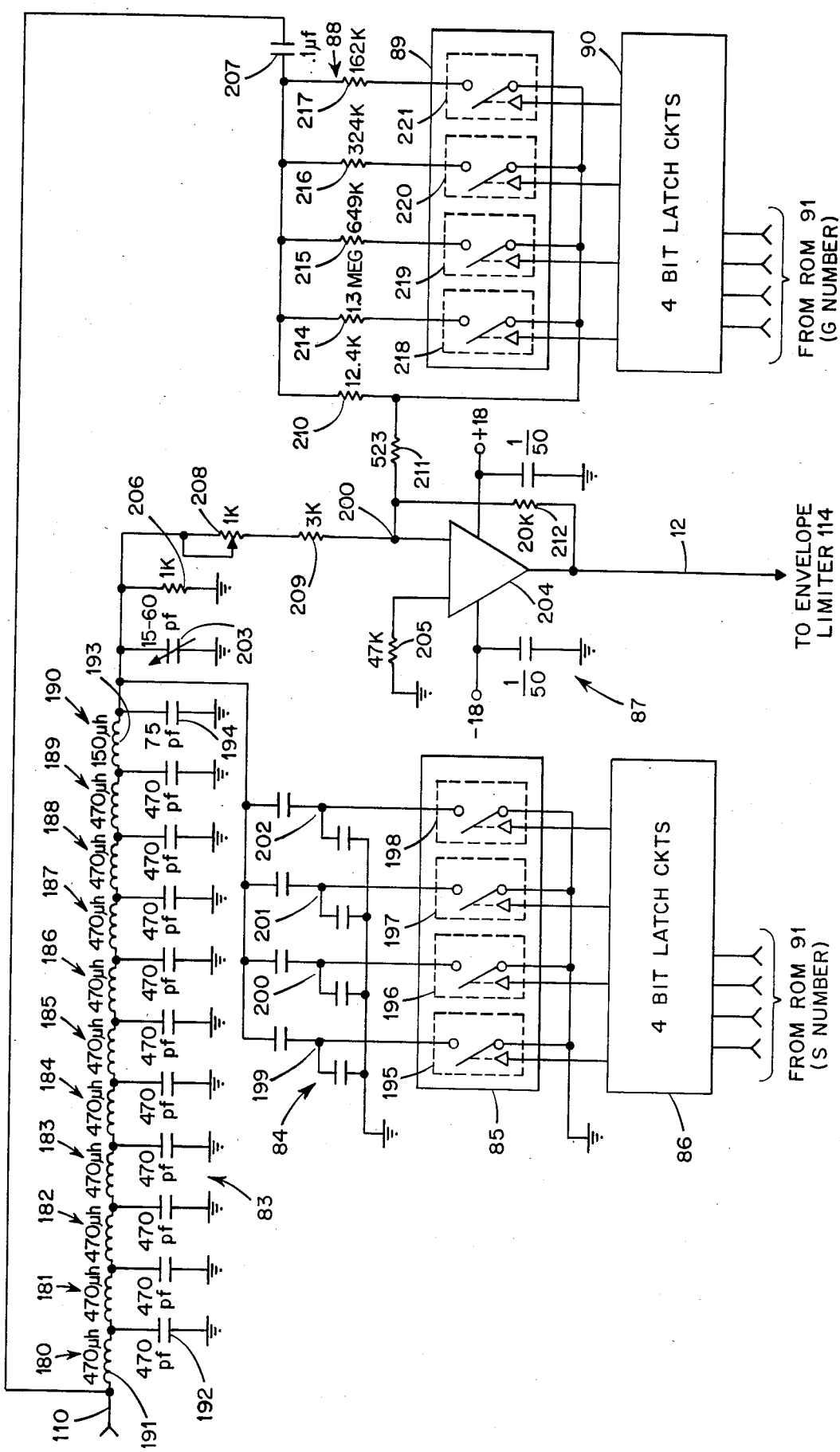
Fig. Z.

Fig. 8a. A HIGH, B HIGH = 0

| B LOW \ A LOW | 15 | 12 | 7 | 3 | 0 |
|---|---|---|---|---|---|
| 15 | G=4, S=4 | 4, 4 | 5, 4 | 5, 4 | 5, 4 |
| 12 | 4, 4 | 4, 4 | 4, 3 | 5, 3 | 5, 3 |
| 7 | 5, 4 | 4, 3 | 5, 3 | 5, 2 | 5, 2 |
| 3 | 5, 4 | 5, 3 | 5, 2 | 6, 0 | 6, 0 |
| 0 | 5, 4 | 5, 3 | 5, 2 | 6, 0 | 7, 0 |

Fig. 8b. A HIGH, B HIGH = 3

| B LOW \ A LOW | 15 | 12 | 7 | 3 | 0 |
|---|---|---|---|---|---|
| 15 | G=2, S=13 | 3, 10 | 3, 10 | 4, 7 | 5, 7 |
| 12 | 3, 10 | 3, 8 | 4, 7 | 4, 7 | 4, 7 |
| 7 | 3, 10 | 4, 7 | 4, 6 | 5, 6 | 5, 6 |
| 3 | 4, 7 | 4, 7 | 5, 6 | 6, 5 | 6, 5 |
| 0 | 5, 7 | 4, 7 | 5, 6 | 6, 5 | 7, 5 |

Fig. 8c. A HIGH, B HIGH = 7

| B LOW \ A LOW | 15 | 12 | 7 | 3 | 0 |
|---|---|---|---|---|---|
| 15 | G=4, S=13 | 4, 13 | 4, 13 | 5, 12 | 5, 12 |
| 12 | 4, 13 | 4, 12 | 5, 11 | 5, 11 | 6, 10 |
| 7 | 4, 13 | 5, 11 | 6, 10 | 6, 10 | 6, 10 |
| 3 | 5, 12 | 5, 11 | 6, 10 | 7, 10 | 7, 10 |
| 0 | 5, 12 | 6, 10 | 6, 10 | 7, 10 | 8, 8 |

Fig. 8d. A HIGH, B HIGH = 12

| B LOW \ A LOW | 15 | 12 | 7 | 3 | 0 |
|---|---|---|---|---|---|
| 15 | G=7, S=15 | 7, 15 | 7, 15 | 8, 15 | 8, 15 |
| 12 | 7, 15 | 7, 15 | 8, 14 | 8, 14 | 8, 14 |
| 7 | 7, 15 | 8, 14 | 8, 14 | 9, 13 | 9, 13 |
| 3 | 8, 15 | 8, 14 | 9, 13 | 10, 11 | 10, 12 |
| 0 | 8, 15 | 8, 14 | 9, 13 | 10, 12 | 11, 12 |

Fig. 8e. A HIGH, B HIGH = 15

| B LOW \ A LOW | 15 | 12 | 7 | 3 | 0 |
|---|---|---|---|---|---|
| 15 | G=9, S=15 | 9, 15 | 10, 15 | 11, 15 | 14, 11 |
| 12 | 9, 15 | 9, 15 | 10, 14 | 11, 14 | 11, 14 |
| 7 | 10, 15 | 10, 14 | 11, 14 | 12, 12 | 12, 12 |
| 3 | 11, 15 | 11, 14 | 12, 12 | 13, 15 | 13, 12 |
| 0 | 14, 11 | 11, 14 | 12, 12 | 13, 12 | 14, 12 |

NOTE:
FOR A LOW = X
 B LOW = Y
AND A LOW = Y
 B LOW = X
G/S ARE THE SAME

RADIO RECEIVER WITH AUTOMATIC INTERFERENCE AND DISTORTION COMPENSATION

BACKGROUND OF THE INVENTION

This invention relates to methods and means of reducing noise and undesired signals in a radio receiver and more particularly for reducing an interfering signal among the Loran beacon signals received by a Loran receiver, by rejecting the interfering signal and compensating for any distortion that occurs as a result of the rejection.

One type of interference in a Loran-C receiver takes the form of one or more narrow band signals at the edge of the band of received beacon signals (90 to 110 KHz). These interfering signals may come from other beacons that transmit just outside of the Loran-C band and, although they are outside the band, they are relatively very high peak power and will interfere with the reception of the desired beacon signals. Heretofore, some efforts have been made to reject these narrow band undesired signals by providing a reject filter in the path of the received signals in the Loran receiver, that includes manually variable capacitor controlled by the Loran receiver operator. This system can be used effectively, but it does require the continual attention of the human operator, and so it is not automatic. It is one object of the present invention to provide a method and means for automatically locating and rejecting undesired narrow band signals in a Loran-C receiver so that the rejection occurs automatically without requiring the attention of an operator.

SUMMARY OF THE INVENTION

The present invention contemplates methods and means of reducing narrow band undesired signals among the received signals in a radio receiver using automatic feedback control that detects the presence of the undesired narrow band signals and automatically varies the center frequency of a narrow band reject filter in the receiver causing the reject filter to shift in frequency to the frequency of the undesired signal, when that signal is located. The undesired signal is then rejected. This rejection can cause excessive distortion of the desired received signals. In particular, in a Loran-C receiver, the rejection distorts the frequency vs phase characteristics of the received Loran beacon signals and, if the rejected frequency is very close to the edge of the Loran-C operating band (90 to 110 KHz), the distortion becomes excessive and it becomes desirable to compensate for this distortion.

In accordance with another feature of the present invention, distortion of the received signals caused by the rejection of an undesired signal is compensated for using a controlled, frequency sensitive circuit in the receiver. Since the distortion occurs as a result of the rejection of a known narrow frequency band, the exact compensation can be anticipated and so a correction can be made using the controlled, frequency sensitive circuit according to a stored program. The input to the program is a value equivalent to the rejected frequency band and the output is one or more control signals to the controlled, frequency sensitive circuit. Thus, the entire receiver system includes two feedback systems: the first feedback system detects an interfering signal among the received signals and controls the variable reject filter to reject the interfering signal; and the second feedback system includes the stored compensating values for controlling the frequency sensitive circuit, by applying those values to it depending on the frequency of the variable reject filter. All feedback here is automatic and so the rejection and the compensation for distortion are both carried out continually, automatically, freeing the operator for other duties.

The particular embodiment of the present invention described herein is a Loran-C receiver, adapted to operate fully in accordance with the above features of the invention. The usual band of operation of a Loran-C receiver is 90 to 110 KHz and, while this band is relatively flat and drops rather sharply at the ends (see FIG. 2), narrow band interfering signals such as from other beacons will produce substantial power overlapping the Loran-C band and so it is advantageous to reject them. This is done with one or more variable, narrow band reject filters, (sometimes called "notch filters") that sweep adjacent the Loran-C band, just above and just below it. For example, two variable reject filters can be used, one variable above and the other variable below the Loran band.

In the Loran-C embodiment described herein, each of the reject filters is a variable tuned circuit in which the variable element is capacitance that is selected from a bank of capacitors that are grouped in a plurality of groups. All capacitors in a group are electrically connected in series with each other, and the groups are electrically connected in parallel in the tuned circuit. Thus, the variable capacitance in the reject filter is equal to the sum of these capacitors. The capacitors are combined in weighted binary multiples by switches controlled by reject filter control values that are binary numbers from a digital computer.

The computer is programmed to operate in a search mode and a reject mode. In the search mode, a variable narrow band sample filter samples the received band. It is stepped (sequenced through a band immediately below (75 to 90 KHz), or immediately above, (110 to 125 KHz), the Loran-C band in search of the maximum interfering signal and a control value equivalent to the frequency of the sample filter, (when the maximum interference is detected), is stored. This control value is a binary number and is used by the computer as the reject filter control value to set the variable capacitance of the reject filter. Thus, the maximum interference is searched out during the search mode and is rejected during the reject mode.

The variable capacitance of the sample filter may also be selected from a bank of capacitors in groups of binary weighted capacitance and selection done by sample filter control values that are binary numbers from the computer. For example, during the search mode, the computer causes switches to the bank of sample capacitors to step through a sequency of capacitance values that varies the frequency of the sample filter in small steps, recording as it goes the maximum intensity samples and the corresponding frequency as represented by the sample filter control value from the computer. In this way, the most intense interfering signal is searched for, located and then rejected.

In the reject mode, the reject filter capacitor bank controlled by the computer is in circuit with the reject filter, placing that filter frequency at the maximum interfering signal and rejecting it. Meanwhile, the signal to noise ratio of the net received signal is continually monitored to be sure that the reject filter is effective. If there is a degradation of the signal to noise ratio, the system goes back to the search mode, again to find the maximum interfering signal. Thus, the complete search-reject cycle including searching out and rejecting the maximum interfering signal from the received signal is repeated whenever the signal to noise ratio of the receiver degrades or falls below a predetermined value.

The rejection of an interfering signal at the edge of the Loran-C band introduces some distortion of the band, particularly to the frequency versus phase characteristics of the received beacon signals. Another feedback system is provided for the distortion compensation. Inasmuch as the distortion is caused by the reject filter of known characteristics at a known frequency the problem of compensating for distortion is eased. For example, at each frequency position of the reject filter the distortion is predetermined and, so a predetermined compensation for that distortion can be stored. One convenient way of compensating for the distortion is to vary the delay and add circuit in the Loran receiver. This can be done by varying the delay and varying the weighting on one of the inputs to the add circuit. Values of the delay and change in weight of an input to the add circuit are stored as functions of the frequency (position) of the reject filter: and for each position of the reject filter, the stored values (binary numbers) are called upon to change the delay and change the weight of an input to the add circuit in the Loran receiver.

It is a principle object of the present invention to provide an improved method and means of reducing interference in a radio receiver.

It is another object to provide a method and means of automatically searching for an interfering signal in a radio receiver and rejecting it.

It is another object to provide a method and means of automatically reducing interference in a radio receiver by rejecting an interfering signal and automatically compensating for the distortion that is introduced by this rejection.

It is another object to provide an improved Loran-C receiver wherein a narrow band, interfering signal at the edges of the Loran-C receiver band is automatically searched out and rejected by a variable reject filter.

It is a further object in conjunction with the above, to provide means in said Loran-C receiver for automatically compensating for the distortion of the received beacon signals that is introduced by the reject filter.

Other features and objects of the present invention will be apparent in view of the following description of embodiments including an embodiment that represents the best known use of the invention and incorporates all features of the invention, taken in conjunction with the drawings.

DESCRIPTION OF THE DRAWINGS

FIG. 7 is a circuit diagram illustrating in detail the variable delay and add subsystem including a bank of capacitors with its set of selector switches and latching circuits for varying the delay function and a bank of resistors with its set of selector switches and latching circuits for varying the add function; and FIGS. 8a to 8e are tables listing some of the stored control values in the distortion compensation ROM for controlling the delay and add circuit in accordance with the frequency settings of the low and high reject filters.

DESCRIPTION OF EMBODIMENTS OF THE INVENTION

Figure 1:
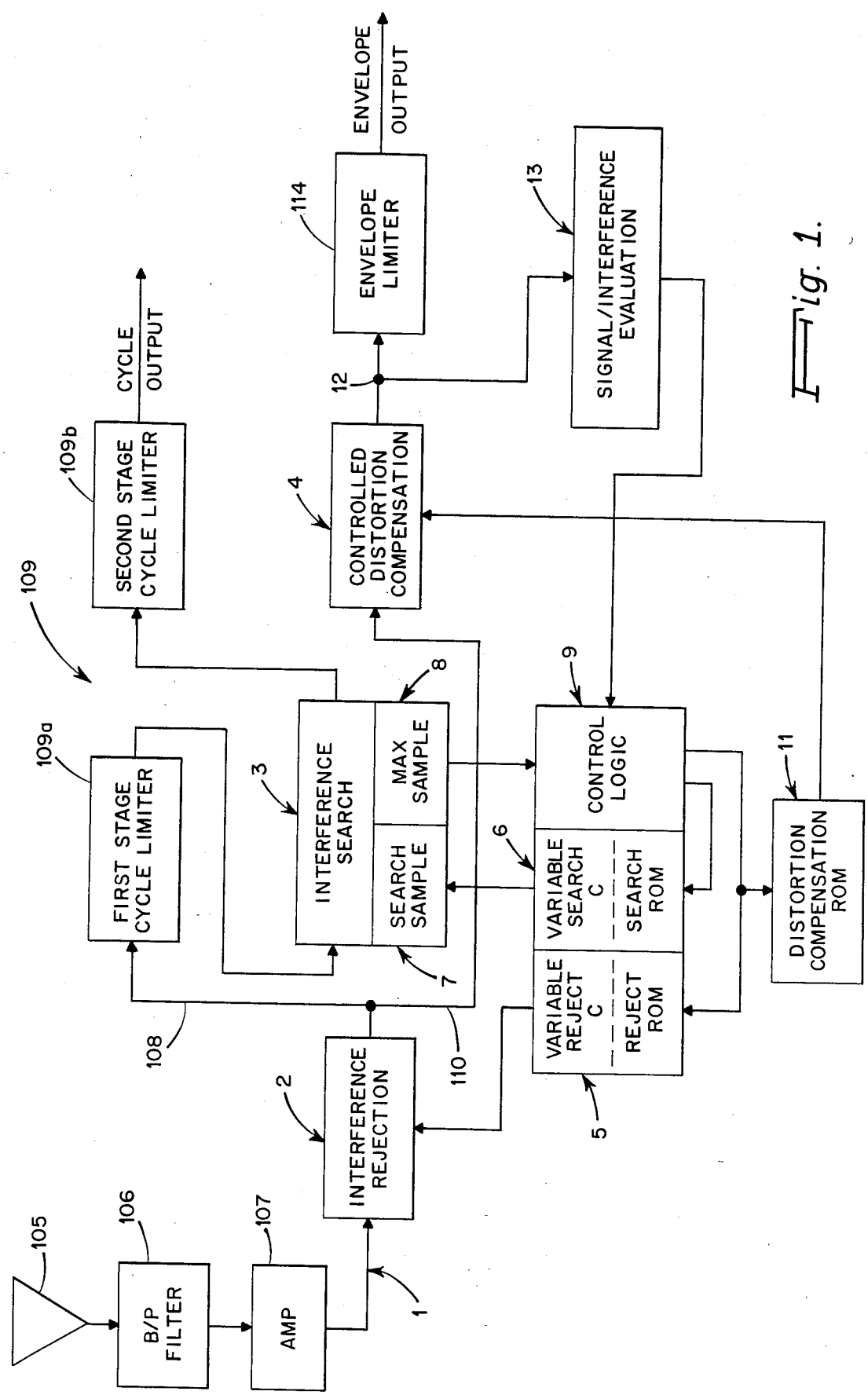
FIG. 1 is a functional block diagram illustrating the essential performance of a Loran receiver incorporating features of the present invention.

Turning first to FIG. 1 there is shown a functional block diagram, illustrating the principle features of the present invention as used in a radio receiver that is tuned to a predetermined frequency band. Only the radio frequency (RF) portion of the receiver is described, because it is that portion of the receiver to which the features of the present invention apply.

More particularly, the radio receiver is a Loran-C receiver, such as described in U.S. Pat. No. 4,166,275, issued Aug. 28, 1979 to Sheldon B. Michaels et al (one of the inventor in the present application). The portion of the Loran-C receiver that the present invention is concerned with is shown in FIG. 10 of said U.S. Pat. No. 4,166,275. That same portion is represented by FIG. 1 in the present application.

FIG. 1 is a functional diagram illustrating the performance of a Loran-C receiver, incorporating features of the present invention. Loran beacon (RF) signals in the band 90 to 110 KHz from the receiver antenna 105 are fed through the receive band pass filter 106 to RF amplifier stage 107. The output of amplifier 107 at 1 is the RF signal received within the band of filter 106 and may include relatively narrow band interfering signals some of which may be just at the edges of that band. Interfering signals at the edges of the band will contain frequencies that overlap the band. It is one object of the present invention to find those narrow band interfering signals and reject them so that they are not included in the RF outputs of the Loran receiver, called Envelope Output and Cycle Output.

The RF signals, including interference, in line 1 are subject to rejection at 2 by, for example, a variable reject filter that is set at the interfering frequency by the variable reject C (capacitance) at 5. First, however, the interference is searched out and measured at 3 between stages 109a and 109b of the cycle limiter, by sampling the RF spectrum at successive frequencies to determine the location of the maximum interfering signal as represented by the count number of the successive frequencies sampled. This is done by varying the C (capacitance) at 6 of the search pass filter at 7, detecting the maximum sample at 8 and sending the count sequence number for that maximum sample to 5, where it sets the reject filter C. In this way, the most intense or maximum interfering signal is identified and the capacitance of the variable reject filter is set to reject that signal. The count sequence is performed at 9 and during the sequence, the count number of the maximum intensity interference determines the reject C and so determines the reject frequency.

As already mentioned, when rejection occurs, through the use of a narrow band reject filter, the received signals are distorted, because a portion of the desired received signals are also rejected. Thus, when rejection occurs, at the same time, controlled distortion compensation occurs at 4 in the envelope line 110. Since the control logic of 5 stores the setting of the reject filter (the variable C thereof) a suitable algorithm can be devised for varying circuit constants at 4 depending on the variable reject C at 5. That algorithm and distortion compensation values, (represented by a multi-dimensional table of values), are provided at 11 for controlling the compensating at 4. More particularly, in a Loran-C receiver, the distortion is compensated for at 4 using a delay and add circuit in which the delay line includes a capacitance that can be varied and the add circuit includes a gain adjustment resistor that can be varied and the values that determine those variations are stored at 11 and fed out to 4, depending on the variable C at 5 that determines the rejected frequency.

During the rejection at 2 and controlled distortion compensation at 4, (called the reject mode), the RF output at 12 is evaluated at 13 by, for example, measuring the signal to noise ratio and feeding this information to 9. Signal to noise ratio, or other signal measures of interest, such as time/difference fluctuations, can be used by the control logic at 9 to determine the effectiveness of the particular distortion compensation values that are applied at 4.

In a preferred embodiment, the signal to noise ratio of the RF signal is measured while interference rejection is occuring. When that ratio falls below a predetermined minimum, the control logic at 9 causes the variable search C to step through successive values in search of a new maximum interference, accompanied by a corresponding change in the frequency of the reject filter, until an acceptable signal to noise ratio is measured at 13. Thereafter, each time that signal to noise ratio falls below the minimum, the search mode begins again accompanied by a new reject mode in which the reject filter is again set by the search at a reject frequency that does satisfy the minimum measure. Clearly, other sequences could be carried out to do substantially the same thing. For example, the reject mode could begin only at the end of the search mode. However, that would take longer to bring about the rejection and distortion compensation.

Another alternate technique is to directly measure distortion at 13 and feed this measure back to controls 9 to modify the distortion compensation control values at 11 that are applied to the delay and add circuit at 4.

Clearly, some of these methods of operation can have use in a radio receiver other than a Loran type receiver, where narrow band interfering signals are a problem. These techniques have use whether the interfering signals are within the band pass of the receiver or at the edges below and/or above the band pass. Furthermore, the technique for rejecting interfering signals can be employed without also using the technique of compensating for the resulting distortion of the received signals. Where the two systems are used together in a Loran type receiver to reject an interfering signal and compensate for the resulting distortion, it is preferred to have a predetermined relationship between the distortion compensation and the rejected frequency band and that can be contained in a stored algorithm.

Loran-C Receiver

Figure 2:
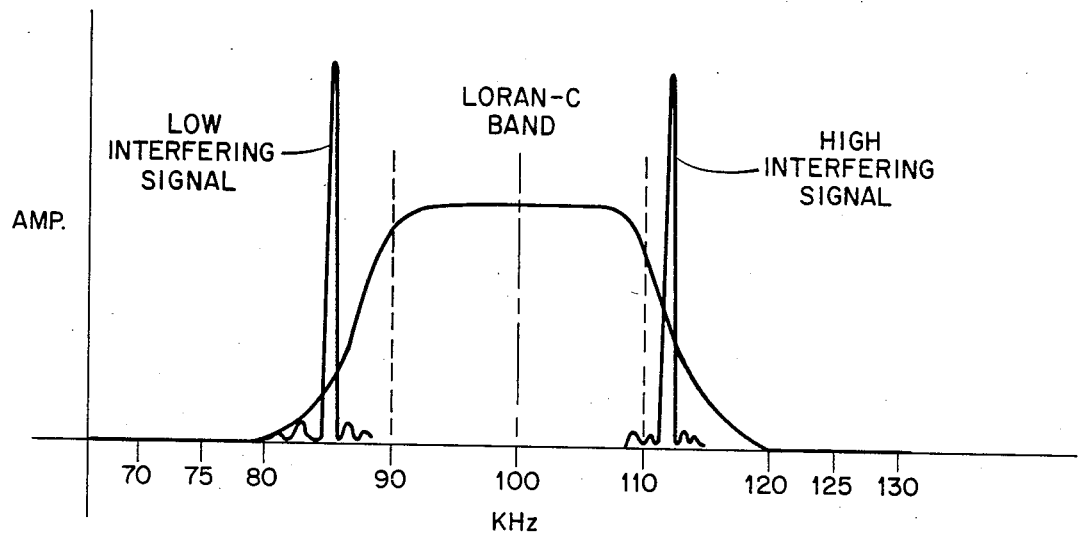
FIG. 2 shows the frequency band width of a Loran-C receive and narrow band interfering signals below and above the band of the kind that can be automatically rejected by incorporating features of the present invention in the receiver.
Figure 3:
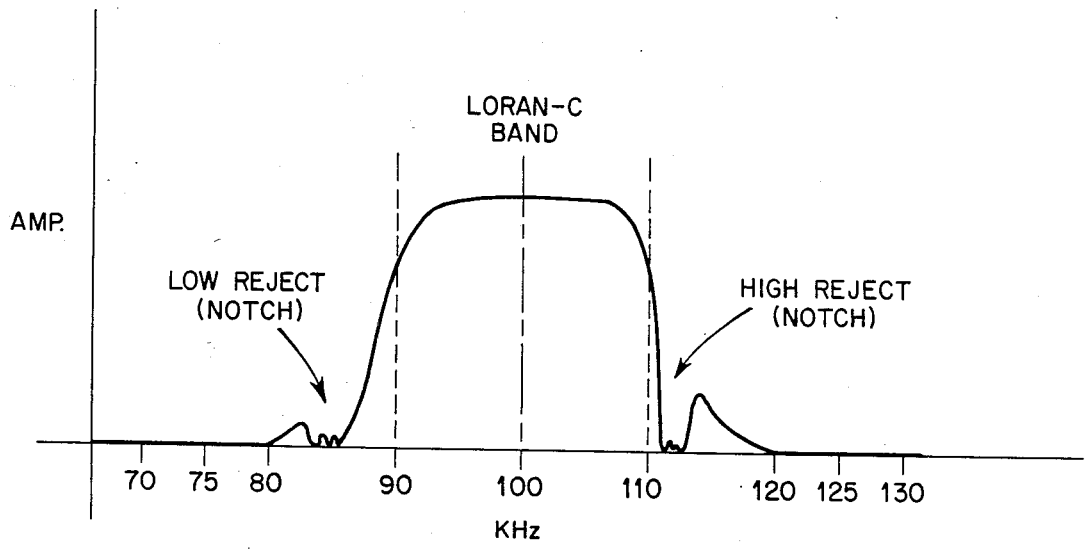
FIG. 3 shows the frequency band of the same Loran-C receiver with rejection of the interfering narrow band signals below and above the Loran-C band by low and high narrow band rejection filters, according to the present invention.
Figure 4A:
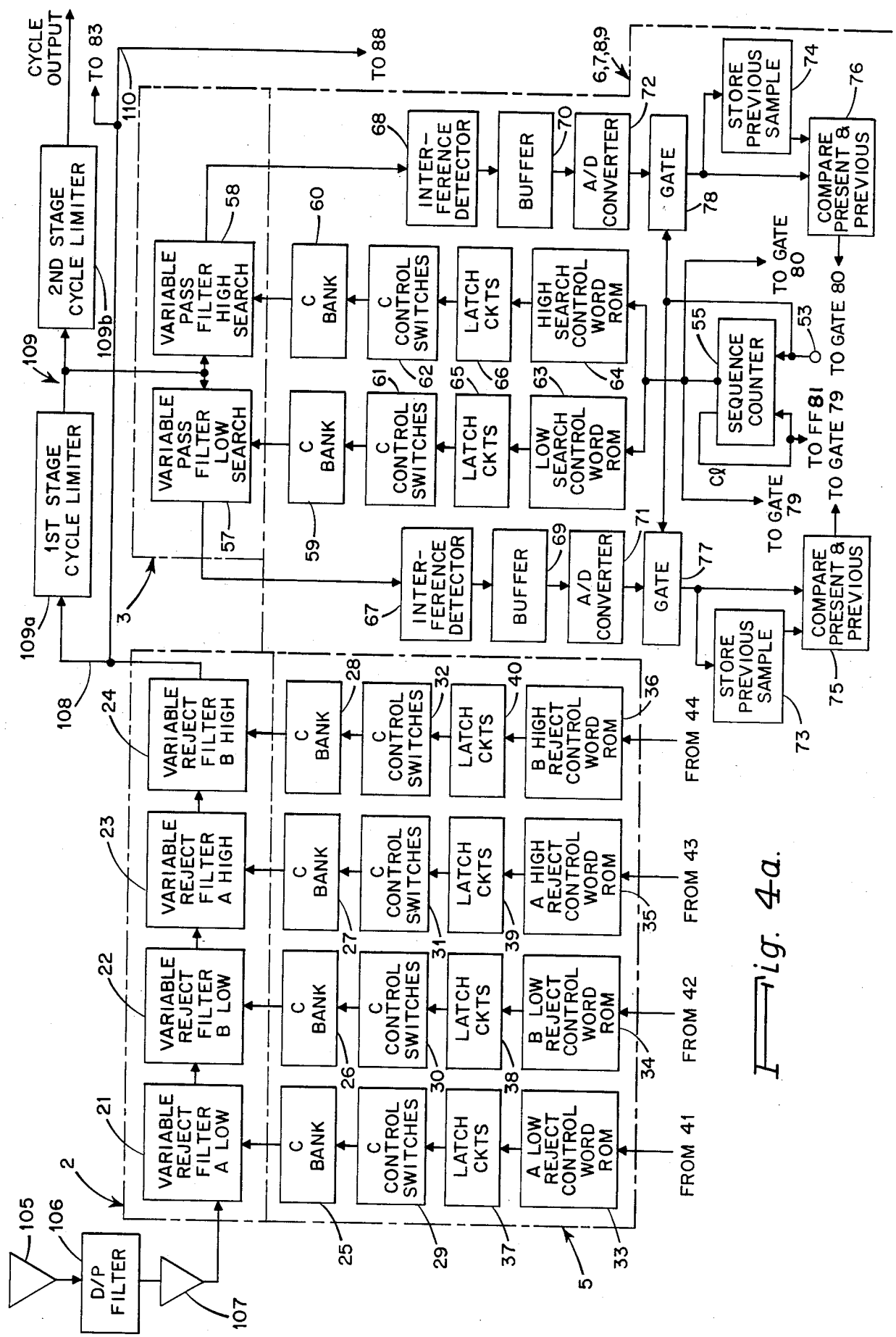
FIGS. 4a and 4b are block diagrams showing the basic control and subsystems in a Loran-C receiver incorporating features of the present invention for automatically rejecting interfering signals below and above the receiver band and compensating for the distortion introduced by the rejection.
Figure 4B:
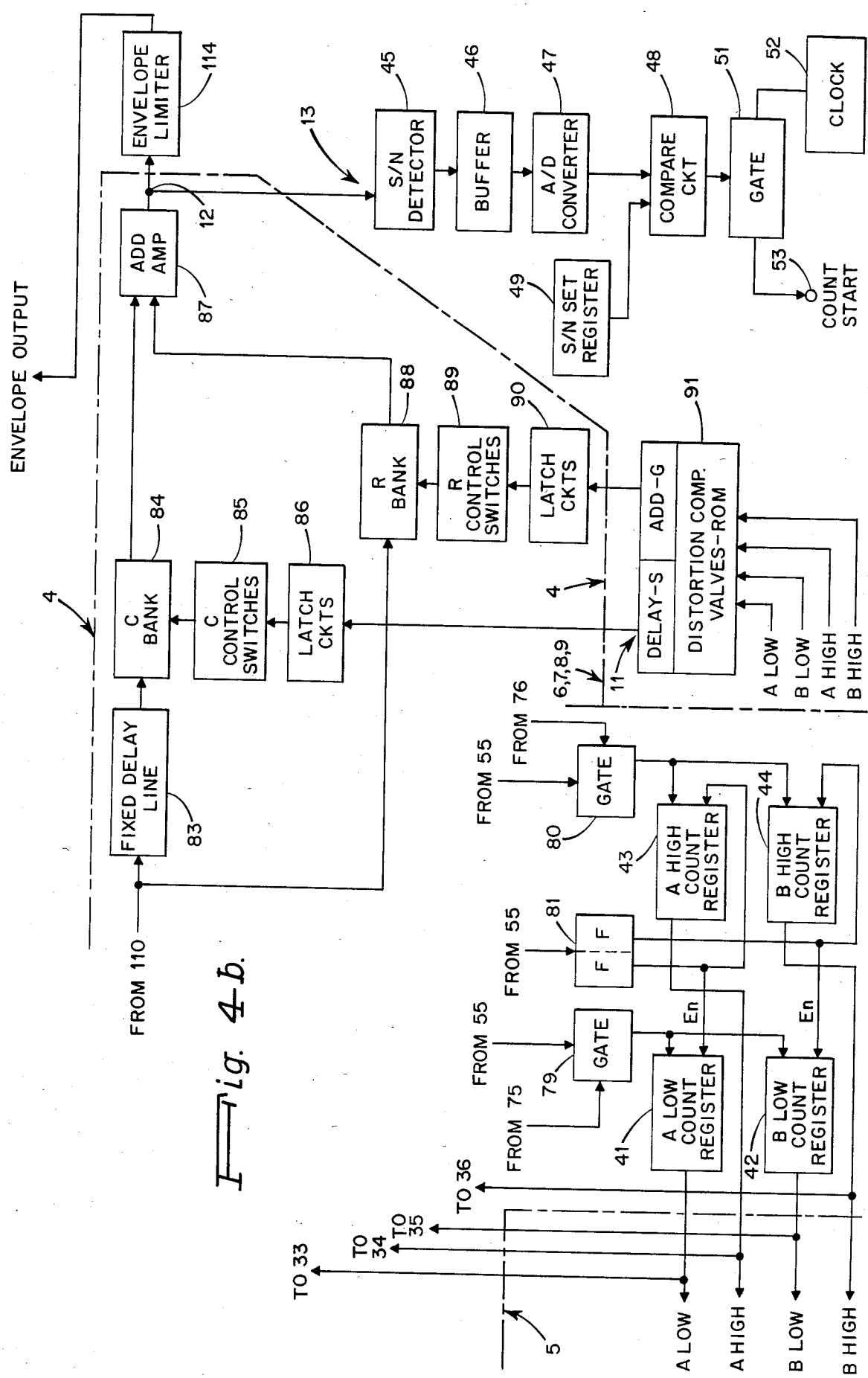

The band pass of a typical Loran-C receiver is illustrated by FIG. 2. This is a plot of power versus frequency showing an essentially flat band from 90 to 110 KHz. Intense narrow band interfering signals are shown at the edges of the Loran-C band, each producing some interfering power in the band. These represent typical narrow interfering bands of transmission that are sometimes within the range of a Loran-C receiver and can interfere with reception of Loran-C beacon signals. When they are rejected, the band appears as shown by FIG. 3. Clearly, the closer the rejection is to the Loran-C band, the greater is the distortion. FIGS. 4a and 4b are a block diagram showing the principle systems and subsystems associated with a Loran-C receiver to incorporate features of the present invention in the receiver.

Turning next to FIGS. 4a and 4b there is shown a block diagram of systems and subsystems in a Loran-C receiver for performing the same functions 1 to 13 as already discussed with reference to FIG. 1. These functions are carried out by the systems and subsystems enclosed within the outline of the functions. Reject filters are provided at both ends of the 90 to 110 KHz band of the Loran-C receiver. More particularly, two variable reject filters are provided at the low end of the band for rejecting in the range 75 to 90 KHz and two filters are provided, in the upper end of the band in the range 110 to 125 KHz. These reject filters are desiganted A Low, B Low, A High and B High. Also, two search and sample narrow band pass filters are provided, one for searching the low end and one for searching the high end.

As shown in FIG. 4, function 2, (interference rejection), is performed by the two low and the two high variable reject filters, 21 to 24. The variable capacitance for each of these filters, each denoted C Bank 25 to 28 are incorporated into their respective filters through switches 29 to 32 that are controlled by their respective control words from ROMs 33 to 36, via latch circuits 37 to 40, respectively. These reject filters reject narrow band interfering signals just below and just above the Loran-C beacon band during the reject mode which occurs in this system, just as soon as an interference signal that exceeds a minimum predetermined intensity is detected by the interference search function 3.

The reject filters 21 to 24 remain set at the frequencies called for by the sequence count numbers in registers 41 to 44, respectively. The search sequence for both the low end and the high end of the band is in the same direction. That is, both the low and the high variable pass search filters begin together and successively step together in the same direction so that one is moving toward the Loran-C operating band (90 to 110 KHz) and the other is moving away from it. In this example, both search filters move from their highest frequency value successively in steps to their lowest frequency value and in doing so, the low search filter moves from 90 to 75 KHz while the high search filter move from 125 to 110 KHz. In this example, the search is done in four steps and so the search count number is zero, one, two, three or four. Thus, all of the reject filters can be placed at the positions farthest from the Loran-C beacon band, 90 to 110 KHz, by setting registers 43 and 44 each at zero and registers 41 and 42 each at four. This can be done by the operator to, in effect, set the reject filters as far out of the way as possible.

In automatic operation, the reject mode goes on all the time, even when there are no interference signals that exceed the minimum and even though the function at 13 says that the signal to noise exceeds a minimum set. The reject mode, under those conditions, continues at the last setting of the count registers 41 through 44. As soon as the signal to noise detected in the envelope line at 12 exceeds a set value, the search mode starts. The function at 13 is performed by a signal to noise (S/N) detector 45 whose output is buffered by buffer circuit 46 and then converted to a digital number by A/D converter 47 and that number is compared with the number from S/N set register 49 by compare circuit 48. When the set value of S/N exceeds the detected value, the output of compare circuit 48 opens gate 51 feeding count pulses from clock 52 to the count start terminal 53. This begins the count sequence in counter 55 that performs in the control search sequence function 9. Thus, begins the search mode.

The functions 6, 7, 8 and 9 described in FIG. 1 are performed by the systems and subsystems shown by block diagram and denoted generally 6, 7, 8 and 9 in FIG. 4a. Function 3, interference search, is performed by the low and high variable pass filters 57 and 58 that tap off signal in the cycle line 108 between the first and second stages of the cycle limiter 109. These are narrow pass filters and their frequencies are varied by varying the combinations of capacitors from C Banks 59 and 60 incorporated with the filter, as determined by the sets of control switches 61 and 62, respectively. Those control numbers are programmed by binary control numbers from ROMs 63 and 64, via latch circuit 65 and 66, respectively. These ROMs are addressed by the output of sequence counter 55 and so they are addressed by the count number of that counter which is zero, one, two, three or four. In this way, the variable pass search filters, both the low and high, sequentially step from their highest frequency value to their lowest frequency value and sample the RF signal taken between stages of the cycle limiter.

The outputs of the two variable pass search filters 57 and 58 are fed to interference detectors 67 and 68, respectively. These detectors produce analogue outputs representative of the magnitude of the interference signal in the sample. They are buffered by buffer circuits 69 and 70 and converted to digital numbers by A/D converters 71 and 72, respectively. The digital numbers from these converters are fed to "store previous sample" registers 73 and 74 and to compare circuits 75 and 76, via gates 77 and 78, respectively, at each count pulse from terminal 53. The registers 73 and 74 store the digital number that represents the previous sample and the compare circuits 75 and 76 compare that number representing the previous sample with the number representing the present sample; and, when the present sample number exceeds the previous, the outputs of the compare circuits 75 and 76 enable gate circuits 79 and 80 that feed the present count number from sequence counter 55 to the registers 41 and 42 or 43 and 44, respectively. Successive count sequences are called the A sequence and the B sequence. During the A sequence, only the A Low and A High count registers 41 and 43 are enabled and then, immediately following, during the B sequence, the B Low and B High count registers are enabled and the A registers are disabled. This is done by flip flop circuit 81 that is set each time the sequence counter 55 complete a count. For example, during the A sequence count of counter 55 from zero to four, flip flop 81 is set to enable the two A count registers and so they respond and register the numbers fed to them via gates 79 and 80, respectively. Upon completion of the first count sequence, flip flop 81 switches and enables registers 42 and 44 to receive the count numbers from gates 79 and 80, respectively. During either sequence, the corresponding registers will change during the sequence whenever the present number (representative of the present interference detected), exceeds the immediately previous number. Thus, the count number stored in the register will always represent the search frequency at which the greatest interference is detected at 67 and 68. Upon completion of sequences A and B, in the event there are several interference signals detected below and several above the Loran band, all of the reject filters will be placed to reject a different interfering signal.

As already mentioned, the frequency range 75 to 90 KHz below the Loran-C band and the frequency range 110 to 125 KHz above the band are searched for interfering signals and the search filters are both stepped in the same direction from the highest to the lowest frequency in the range in four steps. Thus in four steps each search filter moves across a 15 KHz range. For purposes of example, consider the four steps in each 15 KHz range to be as follows:

First step—0 to 3
Second step—3 to 7 KHz
Third step—7 to 12 KHz
Fourth step—12 to 15 KHz.

In making these steps, the low pass filter 57 will step first from 90 to 87 KHz, then to 83 KHz, then to 78 KHz and then to 75 KHz. At the same time, the high pass filter 58 will step from 125 KHz to 122 KHz, then to 118 KHz, then to 113 KHz and finally to 110 KHz. Similarly, the variable reject filters 21 to 24 are controlled by their associated ROMs 33 to 36, respectively to place each of the low reject filters at 90, 87, 83, 78 or 75 KHz while each of the high reject filters are placed at 125, 122, 118, 113 or 110 KHz. Thus, the frequency positions of the reject filters are the same as the positions of the search filters, both below and above the Loran-C band.

For all positions of the reject filters 21 through 24, except perhaps when these filters are all set off by the operator as far as possible from the Loran-C band, these filters will introduce some degree of undesirable distortion of the received beacon signals. According to another features of the present invention, a method and means are provided for compensating for this distortion. This is accomplished by function 4 in conjunction with distortion compensation values from function 11, initiated by function 9, as illustrated in FIG. 1. It is convenient in a Loran receiver to compensate for the distortion by varying the delay and the add functions in the typical delay and add circuit in the Loran reciever. For each position of a reject filter, a change to the delay and a change to the add can be found empirically that compensates for the distortion, by simply setting the reject filter at the particular frequency and then adjusting the delay and the add until the undesirable effects of the distortion are eliminated, or at least substantial compensated for. Similarly, for all combinations of positions of the two low and the two high reject filters 21 to 24, a compensation or change to the delay and a compensation or change to the add can be empirically determined and these compensation values for all combinations can be stored and called upon from storage at each combination to apply compensations to the delay and add. These functions are carried out by the systems and subsystems within the functions denoted 4 and 11 in FIG. 4.

The envelope line 110 feeds through a fixed delay line 83 and to that is added an incremental delay determined by capacitors selected from C Bank 84, depending upon the operation of the C set of control switches 85 by latch circuits 86. At the same time, the add function performed by operational add amplifier 87 is modified by resistors in R Bank 88, depending upon the positions of switches in the R set of control switches 89 operated by latch circuits 90. The C set of control switches 85 and the R set of control switches 89 are controlled by stored digital values called the delay compensation values, S, and the add compensation values, G, from ROM 91. These values are addressed by the A Low, B Low, A High and B High digital numbers from registers 41 through 44 and all combinations of the S and G values are stored in ROM 91 and are fed out as delay and add compensation binary digital numbers to control the C Bank 84 or R Bank 88. FIGS. 8a and 8e are tables showing the compensation values S and G for *some* of the many possible combinations of A Low, B Low, A High and B High. More particularly, these tables show all combinations of A Low and B Low taken when A High and B High are as follows:

FIG. 8a is for A High and B High both 0
FIG. 8b is for A High and B High both 3
FIG. 8c is for A High and B High both 7
FIG. 8d is for A High and B High both 12 and
FIG. 8e is for A High and B High both 15

Clearly, the tables in FIGS. 8a through 8e are not all of the tables necessary to list all possible combinations of the four reject filter settings. These few tables are given by way of example, with the understanding that the values of S and G for all other combinations are determined empirically in the manner described herein and other tables like these are made from those empirical measurements. Upon making all such measurements and preparing all tables, there is a maximum of $5^4 = 625$ different combinations of S and G. This presumes that none of the four reject filters are exactly equal to another. The number of combinations can be reduced by over a half, if the two low filters are substantially equal to each other and the two high filters are substantially equal to each other, because, for example, placing A Low at 15 and B Low at 7 will then be the same as placing A Low at 7 and B Low at 15, and so forth. At any rate, the maximum number of 625, S and G combinations can be stored in the ROM and addressed as described to deliver a value of S and a value of G to the delay and add circuit to compensate for the distortion.

Figure 5:
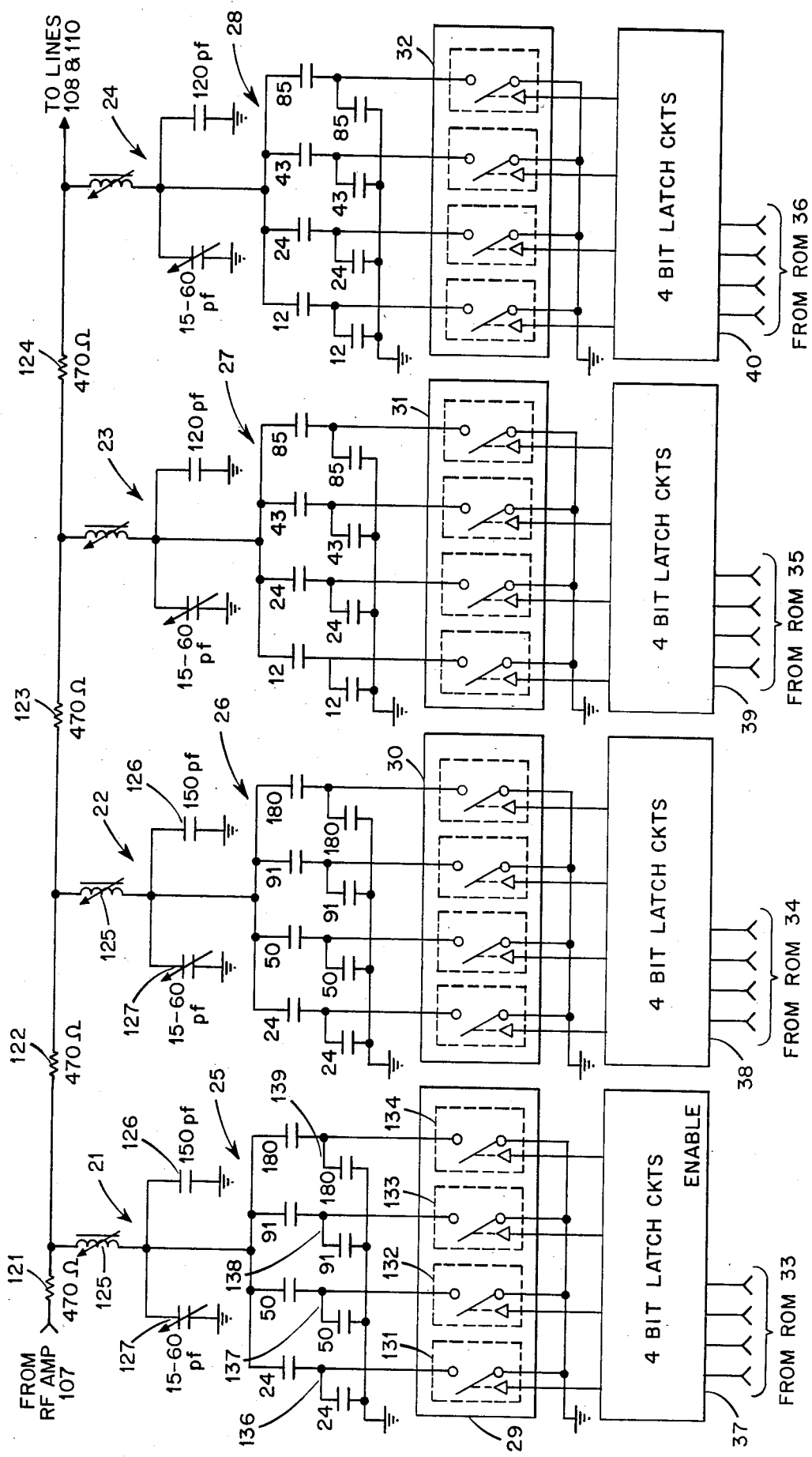
FIG. 5 is a circuit diagram illustrating in detail the two low and the two high reject filters, each with a bank of capacitors, a set of selector switches and latching circuits, controlled to set the frequency of each reject filter in accordance with a digital sequencer.

Some circuit details of the variable reject filters 20 to 24 and their associated capacitor banks and sets of control switches are shown in FIG. 5. The reject filters tap off the transmission line from the RF amplifier 107 at regular impedances 121 to 124 along the line. The two low filters A and B, (21 and 22), each include an adjustable choke 125 in series to ground with a fixed capacitor 126 and an adjustable capacitor 127. For example, in filter 21, these capacitors 126 and 127 are in parallel to ground with selected fixed capacitors from the C Bank 25, depending on the setting of control switches in 29, and those control switches are set by four bit latching circuits 37, depending on the control word fed to the latching circuits from the A Low ROM 33. The control word is a four bit parallel binary number that sets the latches and they, in turn, set the four switches 131 to 134 in 29. For example, when switch 131 is open as shown in the figure, the two capacitors in pair 136, each of which is 24 pf, are in series to ground and so the total capacitance across them is one half of 24 pf or 12 pf. On the other hand, when switch 131 closes, it shorts out one capacitor of the pair 136 and so the capacitance to ground is 24 pf. Similarly, each of the next pairs of capacitors in bank 25, pairs 137, 138 and 139 are connected in series to ground or one capacitor of a pair is shorted out depending on whether the associated switch is open or closed. The value of each capacitor in pair 137 is about twice that of capacitors in pair 136, the value in 138 is about twice the value in 137 and the value in 139 is about twice the value in 138. Thus, switch 132 controls the total capacitance to ground through the C Bank at twice the weight as switch 131, switch 133 controls capacitance to ground at twice the weight as switch 132 and switch 134 controls capacitance to ground at twice the weight as switch 133. In this way, the added capacitance to ground of the reject filter 21 is controlled in binary weighted increments by a binary parallel number from ROM 33 and those numbers are such as to place the filter precisely at the desired frequency: 90, 87, 83, 78 or 75 KHz, below the Loran-C band.

The other reject filters 22, 23, and 24 operate in the same way. More particularly, the B Low filter 22, its associated C Bank 26, set of switches 30 and latching circuits 38 are constructed identical to those with filter 21. Similarly, the A High and B High reject filters 23 and 24 and their C Banks, set of switches and latching circuits are constructed identical to each other. However, the capacitor values in the high reject filters are different from those in the low reject filters and this includes the capacitors within the associated C Bank, because they operate over the high range 125 to 110 KHz. Within a high filter C Bank the capacitor weighting is also substantially binary and each responds to a four bit binary word from its associated ROM, placing the high filters at the desired frequencies 125, 122, 118, 113 or 110 KHz above the Loran-C band. It should be noted that the weighting of the first two pairs of capacitors in a C Bank, like pairs 136 and 137 in 25, is almost exactly binary. However, the weighting from pair 137 to pair 138 is not exactly binary. This is to compensate for stray capacitances between the switches and across terminals of a switch. The same effects are compensated for in C Banks 27 and 28 associated with the high filters 23 and 24. In this figure and others showing circuit capacitors, the capacitor values are often marked alongside the capacitor. All such values marked are in picofarads (pf) unless otherwise noted.

Figure 6:
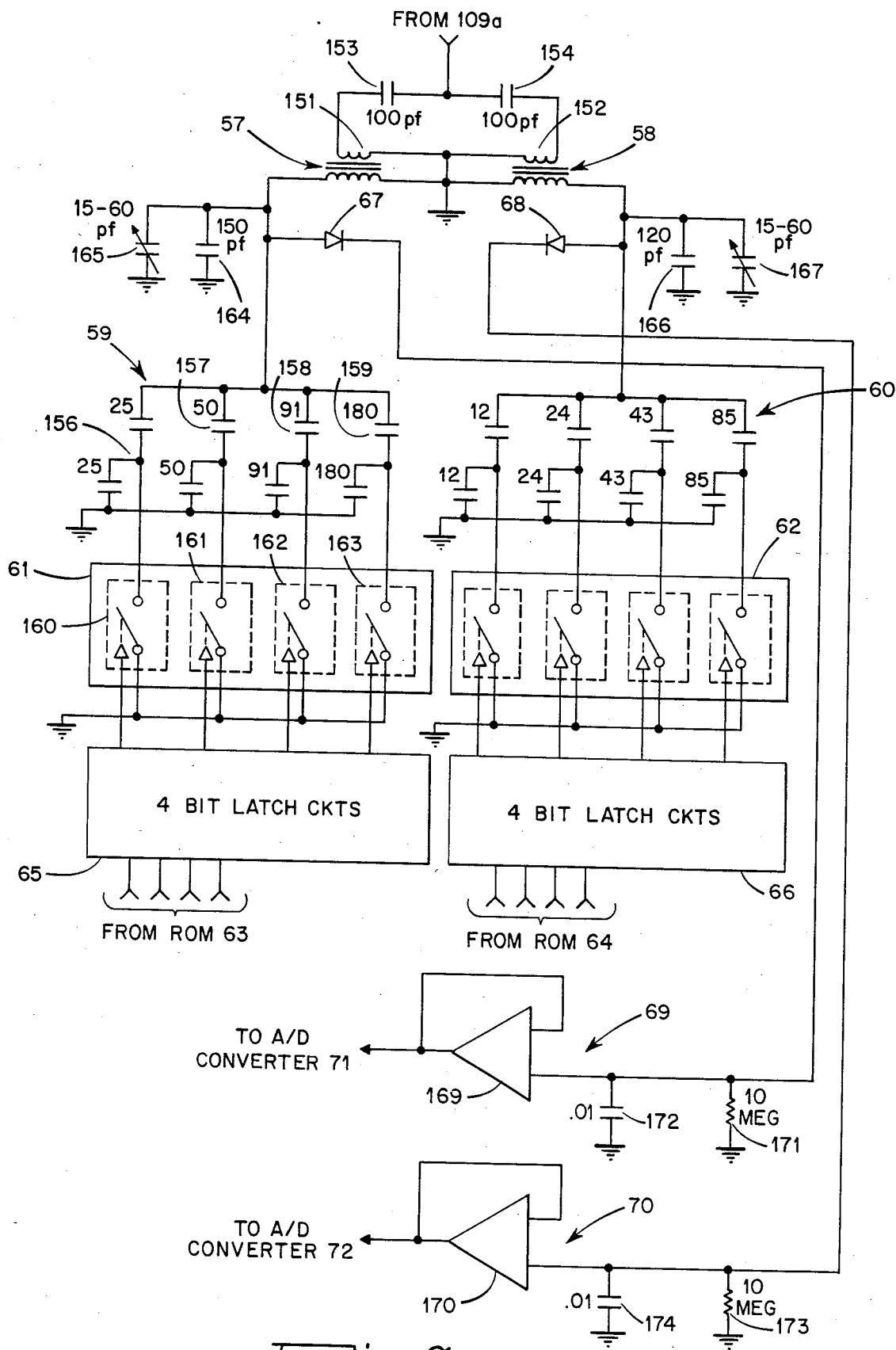
FIG. 6 is a circuit diagram illustrating in detail the RF signal sampler with low and the high variable pass filters each with a bank of capacitors, a set of selector switches and latching circuits, feeding an A/D converter and encoder.

The interference search function 3 and functions 6 and 7, shown implemented in block diagram in FIGS. 4a and 4b are also shown implemented in detail in FIG. 6. The two variable pass search filters, one for searching below the Loran-C band and the other for searching above the Loran-C band are denoted generally 57 and 58, respectively, just as in FIG. 4a. The input to these filters is from between the first and second stages of the cycle limiter 109a and 109b. The input to the filters 57 and 58 is through a pair of transformers 151 and 152, via equal capacitors 153 and 154. The secondaries of each of these transformers is each in parallel to ground with fixed and adjustable capacitors and with the associated C Bank, 59 for filter 57 and 60 for filter 58. Selected capacitors from these banks are incorporated into the associates filter circuit by the associated set of control switches, 61 for filter 57 and 62 for filter 58; and the sets of control switches are actuated by the corresponding latching circuits, 65 for filter 57 and 66 for filter 58, that in turn respond to binary control numbers from associated ROMs 63 and 64, respectively.

The output of filter 57 is detected by diode 67 and fed to buffer circuit 69 that is an operational amplifier. Similarly for filter 58 the output is detected by diode 68 and fed to buffer amplifier 70 that produce analogue signal levels representative of the total RF signal level at the frequency of the filter after the first stage cycle limiter. When that amplitude exceeds a minimum set by the diodes 67 and 68, the buffer amplifiers 69 and 70 produce outputs that are converted to digital numbers by their associated A/D converters 71 and 72, respectively. From that point on, those binary digital numbers are processed in conjunction with the sequence counter 55 to initiate control numbers from ROMs 33 to 36 to their associated reject filters 21 through 24, and also to initiate delay and add correction factors S and G from ROM 91 to the distortion compensation function 4.

The C Banks 59 and 60 operate in much the same fashion as C Banks 25 to 28 described above with reference to FIG. 5. Each C Bank, like C Bank 59, includes four pairs of capacitors, the capacitors in a pair being in series to ground and the successive pairs are weighted binarily. For example, in C Bank 59, each capacitor in the first pair 156 is 25 pf, in the second pair 157, each capacitor is 50 pf, in the third pair 158 each capacitor is 91 pf, and in the fourth pair 159, each capacitor is 180 pf. The associated switches for the pairs 156 to 159 are switches 160 to 163, respectively. When the switch closes, it shorts out the second capacitor in the pair and so the capacitance to ground of that pair is increased by a factor of 2. The switches 61 are controlled by four bit latch circuits 65 that receive a four bit binary number from the associated search control ROM 63. Thus, the four bit binary number from the ROM sets the capacitance to ground from the secondary of the transformer 151 to place the frequency of the low search filter 57 successively at exactly 90, 87, 83, 78 and 75 KHz. In a similar way, C Bank 60 is controlled by a four bit binary number from ROM 64 to step the high filter 58 through the upper range from 125, 122, 118, 113 and 110 KHz.

Other capacitors to ground for filter 57 are fixed capacitor 164 and adjustable capacitor 165 and the equivalent for filter 58 are fixed capacitor 166 and adjustable capacitor 167. The fixed capacitor for the high filter 58 and all the capacitors in its bank (C Bank 60) are lower than the equivalent in the low filter 57, as necessary to place these filters in their desired ranges. And each is adjusted in its range by its adjustable capacitor: 165 for 57 and 167 for 58.

The buffer circuits 69 and 70 are each an operational amplifier and essentially the same. For example, at the input to operational amplifier 169 are 10 M ohm resistor 171 and 0.01 pf capacitor 172, both to ground. The other buffer 70, consists of operational amplifier 170 having a resistor 173 and capacitor 174 to ground at its input from filter 58.

Details of the delay and add circuit shown by block diagram in FIG. 4a are shown in FIG. 7. Fixed delay line 83 is a multistage LC delay line made up of ten identical stages 180 to 189 and an eleventh stage 190. The identical stages each include a 470 microhenry coil, like 191 and a 470 pf capacitor like 192. The eleventh stage 190 is a 150 microhenry coil to ground through a 75 pf capacitor, in parallel with the selected binary weighted capacitors of C Bank 84. Thus, the total delay of line 83 is incremented by binary weighted increments by the selection of capacitors from the C Bank 84; and the selection of those capacitors is determined by the S number from ROM 91. More particularly, the S number is a four bit number that controls the four switches 195 to 198. These control binary selection of the pairs of weighted capacitors 199 to 202. Just as in other C Banks described herein, the value of capacitors in a pair are the same and the total capacitance across successive pairs doubles from each pair to the next. A final adjustment to the total fixed part of the delay is accomplished by adjusting capacitor 203.

The output of the total delay of 83 and 84 in series is fed to the input of add amplifier 87. This includes an operational amplifier 204 having a fixed input from ground through resistor 205 and a variable input at 200 that combines the RF output of the delays 83 and 84 with the undelayed RF output of R Bank 88. The output of these delays is across 1.0K ohm resistor 206 and through adjustable 1.0K ohm resistor 208 and 3.0K ohm resistor 209. The input to R Bank 88 is the RF signal from line 110 through 0.1 mf capacitor 207. R Bank 88 includes binary weighted resistors 214 to 217 that are 1.3 Meg ohm, 649K ohm, 324K ohm and 162K ohm, respectively, in parallel with 12.4K ohm resistor 210. These binary weighted resistors are selected by their associated switch in control switches 89. The output of R Bank 88 and resistor 210, all in parallel, is fed through 523 ohm resistor 211 to the amplifier input at 200. Thus, the delayed RF from line 110 across resistor 206 is fed to the variable input 200 and the same RF from line 110, through the binary weighted resistors of R Bank 88, is also fed to input 200 of amplifier 87, wherein these values are added. The output of amplifier 204 is fed back to the variable input through 20K ohm resistor 212 and so the output voltage from the amplifier across resistor 212 is proportional to the sum of the delayed RF and the weighted RF.

The weighting of the undelayed RF from line 110 is accomplished by the action of switches 89 that connect the binary weighted resistors 214 to 217 in parallel. More particularly, switches 218 to 221 connect weighted resistors 214 to 217, respectively in parallel with 210, depending on the G number from ROM 91. That number is fed to four bit latch circuit 90 that controls the switches. The weighting of the resistors 214 to 217 is such that an increase in the G number from ROM 91 decreases the resistance through R Bank 88 and this increases the RF current flow through R Bank 88 to the variable input 200 of amplifier 204. Hence, the increase in G number increases the multiplier on the undelayed RF from 110 that is added to the delayed RF. For example, if the four bit G number from ROM 91 is 0 0 0 0, all four of the switches 218 to 221 are open as shown in FIG. 7, leaving the weighted resistors 214 to 217 out of the circuit and so the RF current flow for the add, to the variable input of the amplifier 204, is minimum. On the other hand, when the G number is 1 1 1 1, all four of the switches 218 to 221 are closed, putting their associated resistors in the circuit and increasing the RF current flow to input 200 of the amplifier.

Conclusions

The method and apparatus described herein include a technique for automatically rejecting undesired or interfering narrow band signals in a broader band of received signals. Another method and apparatus described herein provides for compensating for the distortion in the desired band of signals that results from the rejection. A particular embodiment is described that incorporated both of these techniques in a Loran-C receiver so that undesired or interfering narrow band signals that usually occur along the edges of the Loran-C band are automatically rejected and the resulting distortion is automatically compensated for. It is clear that the automatic rejection technique can be used in a Loran-C receiver without also using the distortion compensation technique and either technique can be made automatic without also making the other automatic. Also, both techniques can be practiced using analogue apparatus or a hybrid of analogue and digital apparatus. Furthermore, various modifications and alterations of the processes and apparatus described herein could be made by those skilled in the art without deviating from the spirit and scope of the invention as set forth in the appended claims.

What is claimed is:

1. In a radio receiver having an input and an output for receiving desired signals in a predetermined frequency band and automatic tuning apparatus for rejecting a narrow band of undesired received signals among the desired signals in the electrical path of the receiver from said input to said output, including: means in said electrical path for detecting the presence of said undesired narrow band signals among the received signals and producing an output representative thereof, a variable narrow band reject filter in said electrical path of received signals between said detecting means and said input and feedback means controlled by the output of said detecting means producing a feedback output for varying the center frequency of said reject filter to set said center frequency at the undesired narrow band, so that the undesired signals are substantially eliminated from the received signals from the output of said electrical path, the improvement comprising,
   (a) means in said electrical path for compensating for the distortion of said desired signals following said reject filter, including:
   (b) a delay and add circuit in said electrical path having a delay circuit and an add circuit therein each having an input and an output, said add circuit adding together the input and the output of said delay circuit, and
   (c) distortion compensating means for controlling and varying said delay and add circuit depending on the center frequency of the reject filter,
   (d) said distortion compensating means being controlled by said feedback output.

2. A radio receiver as in claim 1 wherein,
   (a) said delay and add circuit is in the electrical path following said reject filter and includes,
   (b) a variable delay in said delay circuit and
   (c) said distortion compensating means controls and varys said variable delay depending on the center frequency of the reject filter.

3. A radio receiver as in claim 1 wherein,
   (a) said delay and add circuit is in said electrical path following said reject filter and includes,
   (b) means for controlling the gain of one of said add circuit inputs and
   (c) said distortion compensating means controls the gain of one of said inputs to said add circuit depending on the center frequency of the reject filter.

4. A radio receiver as in claim 1 wherein,
   (a) said delay and add circuit is in said electrical path following said reject filter and includes,
   (b) a variable delay in said delay circuit and said distortion compensating means includes:
   (c) delay distortion compensation means for controlling said variable delay depending on the center frequency of the reject filter, and
   (d) add distortion compensation means for controlling the gain of one of said inputs to said add circuit depending on the center frequency of the reject filter.

5. A radio receiver as in claim 2 wherein said distortion compensation means includes,
   (a) delay storing means for storing delay control values for said variable delay depending on the center frequency of the reject filter,
   (b) means for coupling said feedback output to said delay storing means and
   (c) means for coupling the output of said delay storing means to said distortion compensation means for controlling the delay of said variable delay.

6. A radio receiver as in claim 3 wherein said distortion compensation means includes,
   (a) add gain storing means for storing control values for the gain of said one add circuit inputs depending on the center frequency of the reject filter,
   (b) means for coupling said feedback output to said add input gain storing means and
   (c) means for coupling the output of said add input gain storing means to control the gain of said one of said add circuit inputs.

7. A radio receiver as in claim 4 wherein said distortion compensating means includes,
   (a) storing means for storing control values for said variable delay and for the gain of said one add circuit input depending on the center frequency of the reject filter,
   (b) means for coupling said feedback output to said storing means and
   (c) means for coupling the outputs of said storing means to said delay distortion compensation means for controlling said variable delay and to said add distortion compensation means for controlling the gain of said one add circuit input.

8. A radio receiver as in claim 4 wherein the undesired received signals are at one edge of said predetermined frequency band where the frequency versus amplitude characteristics of said predetermined frequency band slopes substantially more than between the edges thereof.

9. A radio receiver as in claim 8 wherein the center frequency of the reject filter is varied outside of said predetermined frequency band.

10. A radio receiver as in claim 2 wherein,
   (a) several of the reject filters are provided,
   (b) said several reject filters are controlled by said feedback output and
   (c) said distortion compensating means compensates for the distortion produced by said several reject filters and (d) said control of said distortion compensating means depends on the combination of center frequencies of said several reject filters.

11. In a Loran receiver having an input and an output for receiving Loran beacon signals in a predetermined frequency band, and automatic tuning apparatus for rejecting a narrow band of undesired received signals among the received Loran beacon signals in an electrical path of the Loran receiver from said input to said output including, means in said electrical path for detecting the presence of said undesired received signals among said received Loran beacon signals and producing an output representative of the presence of the undesired received signals, a variable narrow band reject filter of band width substantially less than said predetermined frequency band, in said electrical path between said detecting means and said input, feedback means controlled by the output of said detecting means for varying the center frequency of the reject filter to set the center frequency at the frequency of said undesired received signals so that said undesired received signals are substantially eliminated from the received beacon signals in said electrical path in the Loran receiver, the improvement comprising,
 (a) said reject filter includes capacitance that is variable and is comprised of a reject filter capacitor bank including a multitude of reject filter capacitors of fixed capacitance and
 (b) means for combining selected ones of said fixed capacitance reject filter capacitors in response to the output of said feedback means so that the center frequency of the reject filter varies depending upon the combination of capacitors from said reject filter capacitor bank.

12. A Loran receiver as in claim 11 wherein,
 (a) the capacitors in said reject filter capacitor bank are grouped in a plurality of successive groups that are electrically connected in parallel to each other,
 (b) all of said reject filter capacitors in a group being electrically connected in series with each other,
 (c) reject filter capacitor switches are provided for each successive group for connecting capacitors of the group to the reject filter and
 (d) means responsive to said feedback output for controlling said reject filter capacitor switches for each successive group to combine selected capacitors of the group in series to increment the variable capacitance of said reject filter in binary multiples from group to group.

13. A Loran receiver as in claim 12 wherein,
 (a) said means for controlling said reject filter capacitor switches includes means for storing reject filter binary numbers and
 (b) each of the binary bits of each of said reject filter binary numbers controls one of said reject filter capacitor switches of one of said groups,
 (c) whereby said stored reject filter binary numbers represent the increment to the variable capacitance of the reject filter.

14. A Loran receiver as in claim 13 wherein each of said stored reject filter binary numbers represents a center frequency of the reject filter and when applied to said means for controlling said reject filter capacitor switches causes an increment to the variable capacitance of the reject filter that causes the center frequency thereof to be substantially at said center frequency represented by said applied reject filter number.

15. A Loran receiver as in claim 11 wherein, said means for detecting the presence of the undesired signals includes a variable narrow band pass filter including capacitance that is variable and is comprised of pass filter capacitors selected from a pass filter capacitor bank including a multitude of fixed capacitance pass filter capacitors and means for combining said pass filter capacitors so that the center frequency of said pass filter varies depending upon the combination of capacitors from said pass filter capacitor bank.

16. A Loran receiver as in claim 15 wherein,
 (a) the capacitors in the pass filter capacitor bank are grouped in a plurality of successive groups that are electrically connected in parallel to each other,
 (b) all of said pass filter capacitors in a group being electrically connected in series with each other
 (c) pass filter capacitor switches are provided for each successive group for connecting capacitors of the group to the reject filter and
 (d) means are provided for controlling said pass filter capacitor switches for each successive group to combine selected capacitors of the group in series to increment the variable capacitance of the pass filter in binary multiples from group to group.

17. A Loran receiver as in claim 16 wherein,
 (a) said means for controlling pass filter capacitor switches includes means for storing pass filter binary numbers and
 (b) each of the binary bits of each of said pass filter binary numbers controls one of said pass filter switches of one of said groups,
 (c) whereby said stored pass filter binary numbers represent the increment to the variable capacitance of the pass filter.

18. A Loran receiver as in claim 17 wherein each of said stored pass filter binary numbers represents a center frequency of the pass filter and when applied to said means for controlling the pass filter capacitor switches causes an increment to the variable capacitance of the pass filter that causes the center frequency thereof to be substantially at said frequency represented by said applied pass filter binary number.

19. A Loran receiver as in claim 11 wherein the frequency versus phase characteristics of the predetermined frequency band containing the Loran beacon signals in the electrical path in the Loran receiver is distorted by said reject filter and
 (a) means are provided for compensating for said distortion including:
 (b) a delay and add circuit in said electrical path including a delay circuit and an add circuit, said add circuit having inputs for adding together the input and the output of said delay circuit to provide distortion compensation to said received signals,
 (c) means for controlling and varying said delay and add circuit,
 (d) storing means having an input and an output for storing delay and add circuit control values, said storing means output being selected stored delay and add circuit control values that are selected depending on said storing means input,
 (e) means for coupling said feedback output to said storing means input and
 (f) means for coupling delay and add circuit control values in said storing means output to said controlling means for said delay and add circuit,
 (g) whereby said distortion produced by said variable reject filter is substantially compensated for.

20. A Loran receiver as in claim 19 wherein said delay circuit includes:
  (a) a variable delay including capacitance that is variable and is comprised of a variable delay capacitor bank including a multitude of fixed capacitance delay capacitors and
  (b) means for combining capacitors of said variable delay bank so that the delay of said variable delay circuit varies depending upon the combination of capacitors from said variable delay bank.

21. A Loran receiver as in claim 20 wherein,
  (a) the capacitors in said variable delay capacitor bank are grouped in a plurality of successive groups that are electrically connected in parallel to each other,
  (b) all of said variable delay capacitors in a group being electrically connected in series with each other,
  (c) variable delay capacitor switches are provided for each successive group for connecting capacitors of the group to the variable delay circuit and
  (d) means are provided for controlling said last mentioned switching means for each successive group to combine selected capacitors of the group to increment the variable capacitance of the delay circuit in binary multiples from group to group.

22. A Loran receiver as in claim 21 wherein, said means for storing delay and add control values includes:
  (a) means for storing variable delay binary numbers for controlling said variable delay capacitor switches and
  (b) each of the binary bits of each of said variable delay binary numbers controls one of said variable delay switches of one of said groups,
  (c) whereby said stored variable delay binary numbers represent the increment to said variable delay that results in substantially compensating for the distortion produced by the reject filter.

23. A Loran receiver as in claim 22 wherein each of said stored variable delay binary numbers represents an increment to the delay of said variable delay that results in substantial reduction of the distortion produced by the reject filter at a particular frequency thereof.

24. In a Loran receiver having an input and an output for receiving Loran beacon signals in a predetermined frequency band, the method of reducing the effects of undesired received signals among received Loran beacon signals in an electrical path in the Loran receiver comprising the steps of:
  (a) detecting the presence of the undesired received signals among the received Loran beacon signals in the electrical path in the Loran receiver and producing an output representative of the frequency of said detected undesired received signals,
  (b) rejecting the undesired received signals with a variable narrow band reject filter of band width substantially less than said predetermined frequency band width, in said electrical path in the Loran receiver, and
  (c) varying the center frequency of said variable narrow band reject filter depending upon said output representative of the frequency of detected undesired received signals,
  (d) whereby the undesired received signals are substantially eliminated from said electrical path in the Loran receiver and
  (e) wherein received Loran beacon signals in said electrical path following said variable narrow band reject filter are distorted by the action thereof and including the method of compensating for said distortion by the additional steps of:
  (f) delaying said received Loran beacon signals a variable delay interval depending on the center frequency of said variable narrow band reject filter,
  (g) adding said delayed received Loran beacon signals to the same said received Loran beacon signals not so delayed and
  (h) varying the gain of one of said added signals depending on said center frequency of said variable narrow band reject filter to provide a compensating value for said distortion.

25. In a Loran receiver having an input and an output for receiving Loran beacon signals in a predetermined frequency band, and automatic tuning apparatus for rejecting a narrow band of undesired received signals among the received Loran beacon signals in an electrical path of the Loran receiver from said input to said output including, means in said electrical path for detecting the presence of said undesired received signals among said received Loran beacon signals and producing an output representative of the presence of the undesired received signals, a variable narrow band reject filter of band width substantially less than said predetermined frequency band in said electrical path between said detecting means and said input, and feedback means controlled by the output of said detecting means for varying the center frequency of the reject filter to set the center frequency at the frequency of said undesired received signals, so that said undesired received signals are substantially eliminated from the received beacon signals in said electrical path in the Loran receiver, the improvement comprising,
  (a) means in said electrical path for compensating for the distortion of said desired signals following said reject filter, including:
  (b) a delay and add circuit having a delay circuit and an add circuit therein having inputs for adding together the input and the output of said delay circuit to provide a distortion compensating value to said feedback means, in said electrical path and
  (c) distortion compensating means for controlling and varying said delay and add circuit depending on the center frequency of the reject filter,
  (d) said distortion compensating means being controlled by said feedback output.

26. A Loran receiver as in claim 25 wherein,
  (a) said delay and add circuit is in the electrical path following said reject filter and includes,
  (b) a variable delay in said delay circuit and
  (c) said distortion compensating means controls and varys said variable delay depending on the center frequency of the reject filter.

27. A Loran receiver as in claim 25 wherein,
  (a) said delay and add circuit is in said electrical path following said reject filter and includes,
  (b) means for controlling the gain of one of said add circuit inputs and
  (c) said distortion compensating means controls the gain of said one input to said add circuit depending on the center frequency of the reject filter.

28. A Loran receiver as in claim 25 wherein,
  (a) said delay and add circuit is in said electrical path following said reject filter and includes,
  (b) a variable delay in said delay circuit and said distortion compensating means includes:

(c) delay distortion compensation means for controlling said variable delay depending on the center frequency of the reject filter, and
(d) add distortion compensation means for controlling the gain of one of said inputs to said add circuit depending on the center frequency of the reject filter.

29. A Loran receiver as in claim 26 wherein said distortion compensation means includes,
(a) delay storing means for storing delay control values for said variable delay depending on the center frequency of the reject filter,
(b) for coupling said feedback output to said delay storing means and
(c) means for coupling the output of said delay storing means to said delay distortion compensation means for controlling the of said variable delay.

30. A radio receiver as in claim 28 wherein said distortion compensation means includes,
(a) add gain storing means for storing control values for the gain of said one add circuit input depending on the center frequency of the reject filter,
(b) means for coupling said feedback output to said add input gain storing means and
(c) means for coupling the output of said add input gain storing means to control the gain of said one add circuit input.

31. A radio receiver as in claim 28 wherein said distortion compensating means includes,
(a) storing means for storing control values for said variable delay and for the gain of said one add circuit input depending on the center frequency of the reject filter,
(b) means for coupling said feedback output to said storing means and
(c) means for coupling the outputs of said storing means to said delay distortion compensation means for controlling said variable delay and to said add distortion compensation means for controlling the gain of said one add circuit input.

32. A Loran receiver as in claim 28 wherein the undesired received signals are at one edge of said predetermined frequency band where the frequency versus amplitude characteristics of said predetermined frequency band slopes substantially more than between the edges thereof.

33. A Loran receiver as in claim 32 wherein the center frequency of the reject filter is varied outside of said predetermined frequency band.

34. A Loran receiver as in claim 26 wherein,
(a) several of said reject frlters are provided,
(b) said several reject filters are controlled by said feedback output and
(c) said distortion compensating means compensates for the distortion produced by said several reject filters and
(d) control of said distortion compensating means depends on the combination of center frequencies of said several reject filters.

* * * * *